United States Patent
Bustle et al.

(10) Patent No.: US 11,099,439 B2
(45) Date of Patent: Aug. 24, 2021

(54) DISPLAY DEVICE ASSEMBLY HAVING A SPACER LAYER SURROUNDING THE INTEGRATED CIRCUIT

(71) Applicant: Apple Inc., Cupertino, CA (US)

(72) Inventors: Benjamin S. Bustle, Cupertino, CA (US); Rasamy Phouthavong, San Jose, CA (US); Benjamin J. Pope, Mountain View, CA (US); Richard Hung Minh Dinh, Saratoga, CA (US); Michael W. Firka, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/262,764

(22) Filed: Jan. 30, 2019

(65) Prior Publication Data

US 2020/0081288 A1 Mar. 12, 2020

Related U.S. Application Data

(60) Provisional application No. 62/729,974, filed on Sep. 11, 2018.

(51) Int. Cl.
| | |
|---|---|
| *G02F 1/1345* | (2006.01) |
| *G02F 1/1333* | (2006.01) |
| *H05K 1/02* | (2006.01) |
| *H05K 1/18* | (2006.01) |
| *H04R 1/02* | (2006.01) |
| *G02F 1/1368* | (2006.01) |
| *G02F 1/13357* | (2006.01) |

(52) U.S. Cl.
CPC .... *G02F 1/13452* (2013.01); *G02F 1/133308* (2013.01); *H05K 1/028* (2013.01); *H05K 1/189* (2013.01); *G02F 1/1336* (2013.01); *G02F 1/1368* (2013.01); *G02F 1/13332* (2021.01); *G02F 1/13338* (2013.01); *G02F 1/133314* (2021.01); *G02F 1/133331* (2021.01); *H04R 1/028* (2013.01); *H04R 2499/15* (2013.01); *H05K 2201/056* (2013.01); *H05K 2201/2036* (2013.01)

(58) Field of Classification Search
CPC combination set(s) only.
See application file for complete search history.

(56) References Cited

U.S. PATENT DOCUMENTS

| | | | |
|---|---|---|---|
| 8,243,027 B2 | 8/2012 | Hotelling et al. | |
| 8,922,511 B1* | 12/2014 | Salmon | G06F 1/1643 345/173 |
| 2014/0055702 A1* | 2/2014 | Park | H01L 27/1218 349/43 |
| 2014/0211122 A1* | 7/2014 | Wurzel | G02F 1/133308 349/61 |

(Continued)

FOREIGN PATENT DOCUMENTS

CN 107315272 11/2017

*Primary Examiner* — Lauren Nguyen
(74) *Attorney, Agent, or Firm* — Morgan, Lewis & Bockius, LLP (57) ABSTRACT

A disclosed display device assembly includes a panel substrate, multiple light transmitting pixels disposed over the panel substrate, a backlight unit disposed under the panel substrate, a flexible substrate attached to the panel substrate, and a display integrated circuit mounted to the flexible substrate and disposed under the backlight unit.

17 Claims, 4 Drawing Sheets

(56) References Cited

U.S. PATENT DOCUMENTS

| | | | |
|---|---|---|---|
| 2015/0253613 A1* | 9/2015 | Yoon | G02F 1/13452 |
| | | | 349/58 |
| 2016/0204366 A1 | 7/2016 | Zhang et al. | |
| 2016/0219354 A1* | 7/2016 | Kim | G02B 5/3033 |
| 2016/0291745 A1 | 10/2016 | Grip | |
| 2017/0146850 A1* | 5/2017 | Lee | H05K 999/99 |

* cited by examiner

DISPLAY DEVICE ASSEMBLY HAVING A SPACER LAYER SURROUNDING THE INTEGRATED CIRCUIT

CROSS-REFERENCE TO RELATED APPLICATIONS

This application claims the benefit of U.S. Provisional Application No. 62/729,974, entitled "DISPLAY DEVICE ASSEMBLY," filed Sep. 11, 2018, the entirety of which is incorporated herein by reference.

TECHNICAL FIELD

The present description relates generally to display devices, and more particularly, to a liquid crystal display (LCD) device assembly for a portable electronic device.

BACKGROUND

Displays are used in a variety of electronic devices, such as tablet computers, cell phones, wearable devices, and other portable devices to output visual information. The viewing area within which an image can be presented by a display device is typically constrained by the need to assemble display components or other components of the electronic device together with the display device.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The following disclosure relates to an LCD device that utilizes a display panel and an integrated circuit or chip coupled to the display panel for driving signals onto an array of light transmitting pixels. According to some embodiments described herein, the integrated circuit can be mounted to a flexible substrate using a chip-on-flex (COF) assembly and coupled to the pixel array through attachment of the flexible substrate to the display panel. The flexible substrate can be wrapped around an edge of the display panel to position the display integrated circuit behind the display panel, such as behind a backlight unit in a region where it does not occlude the image or light presented by the display. This can, for example, allow for a reduction in size of an inactive border area of the display or increase an active display area occupied by the pixel array by avoiding a need to mount the integrated circuit directly to the panel using a chip-on-glass (COG) attachment in an area bordering the pixel array. The housing of an electronic device containing the display panel can further include structural features in a sidewall region near to an edge of the display panel that serves to maintain structural integrity, a water seal, and/or maintain a cosmetic appearance of the device near the edge of the display panel. As a result, a substantially edge-to-edge appearance of the display area in an electronic device may be achieved.

These and other embodiments are discussed below with reference to FIGS. 1-4. However, those skilled in the art will readily appreciate that the detailed description given herein with respect to these Figures is for explanatory purposes only and should not be construed as limiting.

Figure 1:
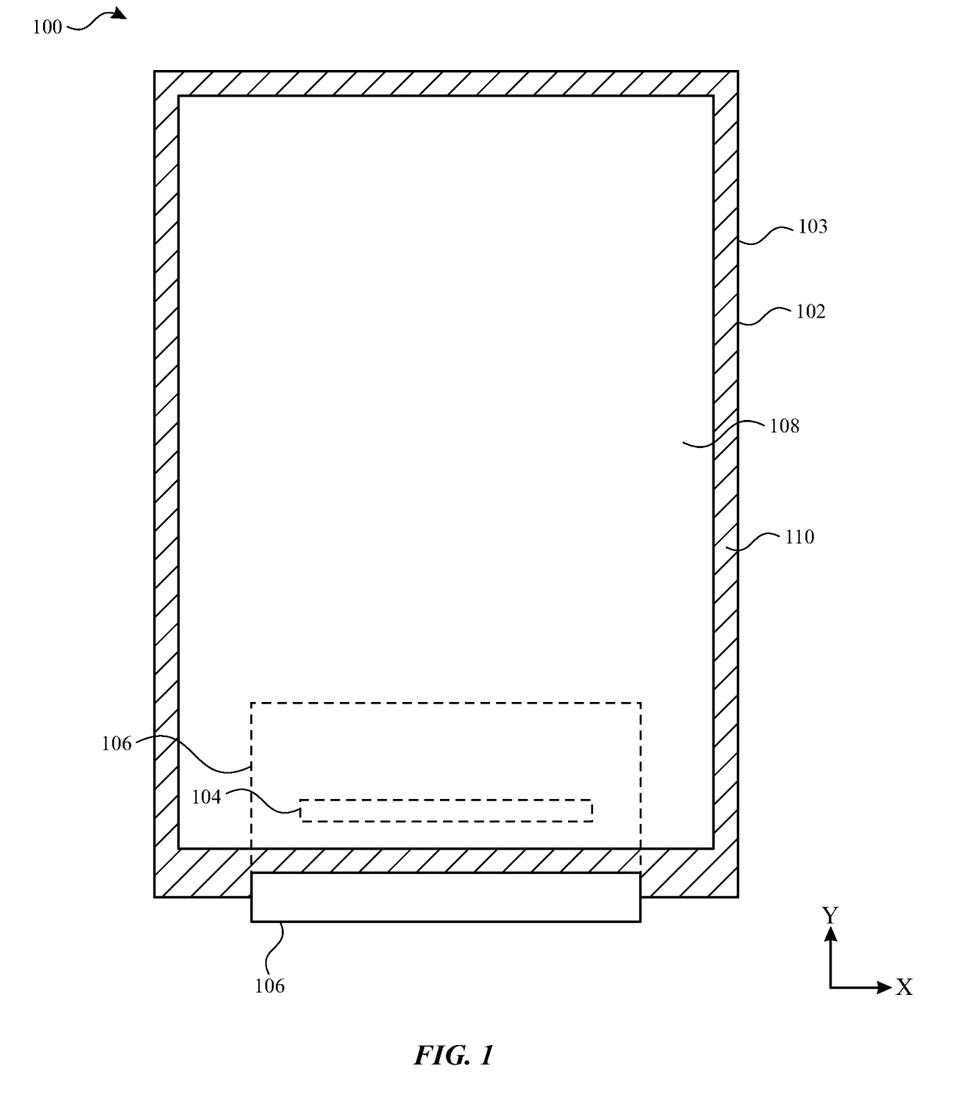
FIG. 1 is a front view of a display assembly, in accordance with some embodiments.

FIG. 1 is a front view showing an example of a display device 100, in accordance with some embodiments. In the illustrated example of FIG. 1, the display device 100 includes a display panel 103 and a display integrated circuit (IC) 104 that is operatively coupled to the display panel 103. The display panel 103 includes a panel substrate 102 onto which operative and functional components of the display panel 103 can be formed, such as pixel circuits, optical layers, and the like. The display IC 104 is coupled to the display panel 103 via a flexible substrate 106 so that the display IC 104 can provide signals to the display panel 103, such as voltage and/or current signals, for driving or otherwise operating components of the display panel.

As shown in FIG. 1, an active area 108 and an inactive area 110 can be defined on or over the panel substrate 102. The active area 108 (also referred to herein as a "display active area") provides a region of the display panel 103 within which an image or series of images can be presented and seen by a viewer. The image(s) can, for example, present text, video, pictures, or other graphical information to a viewer. The inactive area 110 (shaded area in the example of FIG. 1) can include a region outside of the active area 108 within which no display image is presented by the display panel 103 or within which no display image can be seen by the viewer. For example, as shown in FIG. 1, the inactive area 110 can surround the active area 108 in a perimeter region of the panel substrate 102, or the inactive area 110 can otherwise be included a perimeter region near one or more borders of the panel substrate 102.

In FIG. 1, the display device 100 is shown in an example assembled configuration. Portions of the flexible substrate 106 that are disposed over or in front of the panel substrate 102 are illustrated with solid lines, while portions of the flexible substrate 106 that are disposed under or behind the panel substrate 102 are illustrated with dashed lines. As shown in the example of FIG. 1, a portion of the flexible substrate 106 can be bonded to a front side, i.e., a viewing side, of the panel substrate 102, which can provide an electrical connection between the flexible substrate 106 and components formed on the front side of the panel substrate 102. The flexible substrate 106 can be wrapped or bent around an edge of the panel substrate 102 so that another portion of the flexible substrate 106 onto which the display IC 104 is mounted can be disposed behind the panel substrate 102.

A wrap around flex assembly for the display IC 104 like the example shown in FIG. 1 can allow the display IC 104 to be disposed behind the display panel 103 and even overlap with the active area 108 without obscuring the image presented in the active area 108. Compared to an implementation in which the display IC 104 is mounted directly on the front side of the panel substrate 102, the arrangement utilizing a display IC 104 mounted to flexible substrate 106 can allow a size of the inactive area 110 to be reduced. For example as shown in FIG. 1, a portion of the flexible substrate 106 can be attached to the front side of the panel substrate 102 on a bottom border region adjacent to the bottom edge of the panel substrate to allow a size of the inactive area 110 in a Y-dimension to be reduced. In this example frame of reference and construction, the display panel 103 has a rectangular shape in which the Y-dimension corresponds to a longer dimension of the active area 108, and the X-dimension corresponds to a shorter dimension of the active area 108. However, other shapes and constructions are contemplated, such as square-shaped or rounded display panels, among other possibilities. Further, it is contemplated that the flexible substrate 106 can be attached to any other border of the panel substrate 102, such as the top border region, the left border region, or the right border region with respect to the orientation of FIG. 1.

Figure 2:
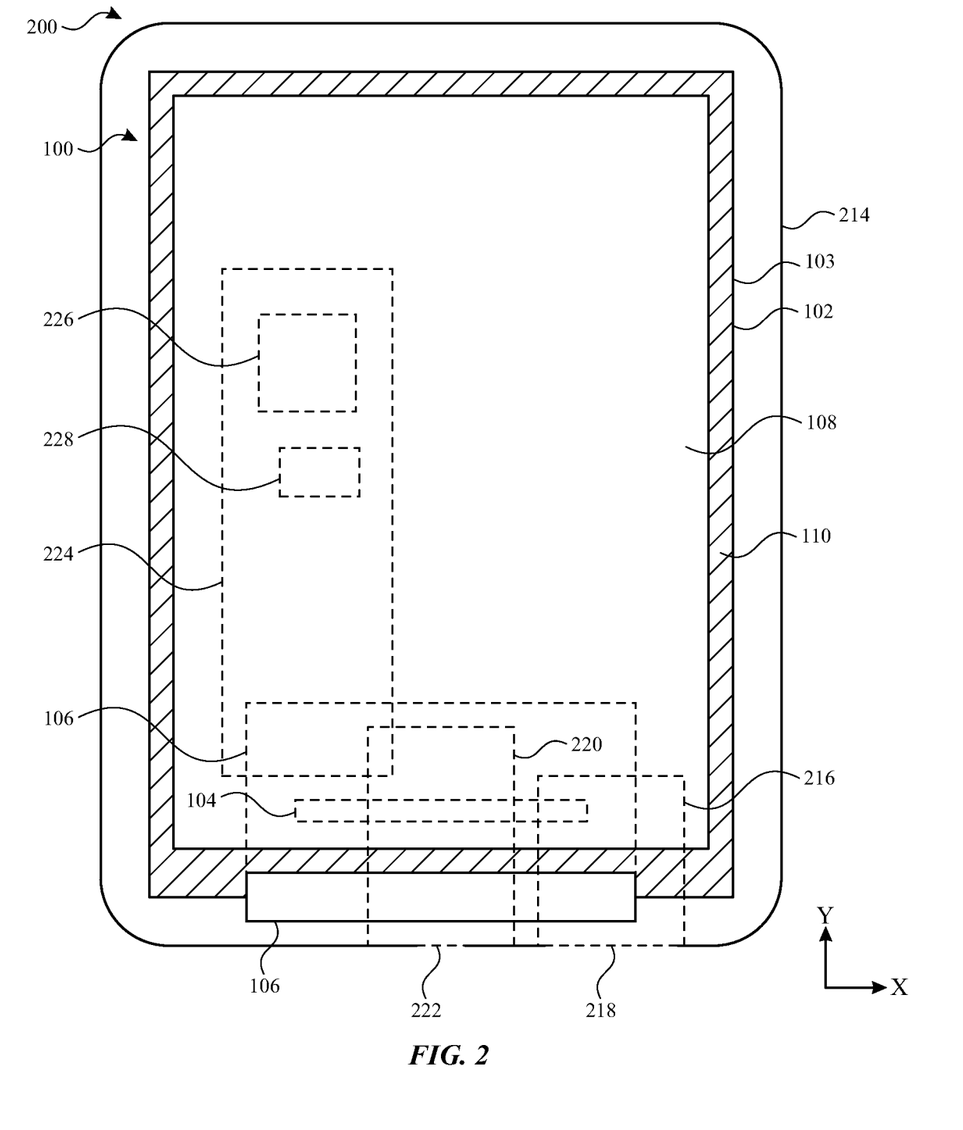
FIG. 2 is a front view of an electronic device, in accordance with some embodiments.

FIG. 2 is a front view showing an example of an electronic device 200, in accordance with some embodiments. The electronic device 200 shown in FIG. 2 includes the display device 100 assembled in the same configuration as that shown FIG. 1. The electronic device 200 can be, for example, a smart phone, tablet computer, wearable device, or other portable communication device. While the example is described with reference to a portable communication device, it will be appreciated that principles of the display device 100 and assemblies described herein can be applicable to other types of electronic devices, including, without limitation, standalone display devices and non-portable electronic devices.

Referring to FIG. 2, the display device 100 can be assembled together with other functional components of the electronic device 200 within a housing 214, which can provide a common housing for various components of the electronic device 200. The housing 214 can serve to enclose and support various internal and/or functional components of the electronic device 200, and the housing 214 can, for example, be made from plastic, metal such as aluminum and/or steel, glass, ceramic, and/or other rigid materials. In particular implementations, the housing 214 can include a single integral component or multiple components bonded or otherwise attached together.

As shown for example in FIG. 2, the display IC 104 can be a relatively long component. In the example shown in FIG. 2, the display IC 104 has a high aspect ratio with an areal extent that is relatively long in the X-dimension, although it will be appreciated that the display IC 104 can have other structural arrangements or be disposed in various different orientations with respect to the housing 214 of the electronic device 200. As shown in FIG. 2, the display IC 104 mounted to flexible substrate 106 can be assembled within the housing 214 so that the display IC 104 overlaps with other internal and/or functional components assembled in the housing 214. This may, for example, allow for a compact exterior dimension of the electronic device 200, while still accommodating the display IC 104 within the housing and allowing a relatively large areal extent of the exterior of the electronic device to be used for the active area 108.

As shown for example in FIG. 2, the display IC 104 can be assembled within the housing 214 so that the display IC 104 (and a portion of the flexible substrate 106 onto which the display IC 104 is mounted) overlaps with one or more other input/output devices. For example, the display IC 104 can overlap with a speaker 216, which can be disposed adjacent or otherwise near to a border of the housing 214 so that the speaker 216 can interact externally with a listener or user.

A speaker opening 218, such as, for example, a hole, a mesh, a porous screen, and/or a grill, can be provided through the housing 214 to facilitate acoustic transmission (transmission of sounds) through or across the housing 214. Although a speaker 216 is provided in the example electronic device 200, it is contemplated that similar principles of the assembly and speaker 216 can apply to other acoustic devices, such as a microphone. Additionally or alternatively, the display IC 104 can be assembled within the housing 214 so that it overlaps with one or more other input/output devices, which can be included on or near a border to the housing 214 to permit the other input/output devices to interact externally. For example, the display IC 104 can overlap with one or more buttons having an input surface disposed on an edge of the housing 214.

As shown for example in FIG. 2, the display IC 104 can additionally or alternatively be assembled within the housing 214 so that the display IC 104 overlaps with one or more connection interface components, such as a connector 220. The connector 220 shown in FIG. 2 can be implemented as a data bus and/or power connector that provides an interface for connecting the electronic device 200 to an external cord, such as a power cable and/or data transmission cable. In a particular implementation, the connector 220 can be a combined data and power connector that utilizes a standardized protocol and pin-out configuration, such as USB, USB-C, lightning, and/or any other appropriate interface, to receive power for charging a battery or power source of the electronic device 200 and also permit data signals to be sent to and/or from the electronic device. As shown in the example of FIG. 2, the housing 214 can include a connector opening 222, which can accommodate a port for inserting or otherwise coupling an external component such as an external cord or cable to the connector 220 through the housing 214.

As seen in FIG. 2, the areal extent of various components can at least partially overlap. This may, for example, facilitate reduction of the inactive area 110 by allowing one or more functional electronic components included in the device housing to at least partially overlap. As used herein, the "areal extent" of components refers to the area occupied by the orthogonal projection of the components when the components are orthogonally projected onto a common projection plane. For example, with respect to FIG. 2, the active area 108 is arranged in an X-Y plane. A Z-axis can extend orthogonally to the X-Y axes shown in the figure (i.e., into the page). Various functional electronic components such as the display IC 104, the speaker 216, and the connector 220 are shown in this example with an areal extent that at least partially overlaps with the active area 108. When each of these components are orthogonally projected along the Z-axis onto the X-Y plane defined by the active area 108, the X-Y positions of at least a portion of each of these projections coincides with the X-Y positions of at least portion of the active area 108 because the areal extents of these components at least partially overlap with the active area 108.

According to some embodiments, the flexible substrate 106 onto which the display IC 104 is mounted can be utilized for exchanging signals between the display IC 104 and the display panel 103, and the same flexible substrate can be utilized for exchanging signals between the display IC 104 and other components of the electronic device 200, such as one or more processors, integrated circuits, printed circuit boards, or other circuitry. For example, the flexible substrate 106 can be implemented as a flexible printed circuit (FPC) or interposer flexible providing one or more signal paths for ground connection, power connection, data connection, and the like.

As shown in FIG. 2, the flexible substrate 106 can be coupled directly or indirectly to a main logic board 224 contained within the housing 214. The main logic board 224 can be, for example, a printed circuit board (PCB) or other suitable component that serves to provide a mechanical attachment to and electrical interconnection between various components of the electronic device 200, such as a processor 226, a memory 228, surface mount technology (SMT) components, connectors, interconnections, and/or other components. The display IC 104 can communicate with the processor 226 and/or other components on the main logic board 224 via the flexible substrate 106, such as, for example, to receive frame data and/or commands from the processor 226 to display an image. The processor 226 can be, for example, a host processor, a central processing unit (CPU), a graphics processing unit (GPU), and/or a controller IC, and can be configured to execute instructions in the memory 228 and/or read/write data to or from the memory 228. Although illustrated in FIG. 2 as simple rectangles, it will be appreciated that the flexible substrate 106 and main logic board 224 can be implemented with a variety of different shapes and constructions to accommodate various components with the electronic device assembly.

Figure 3:
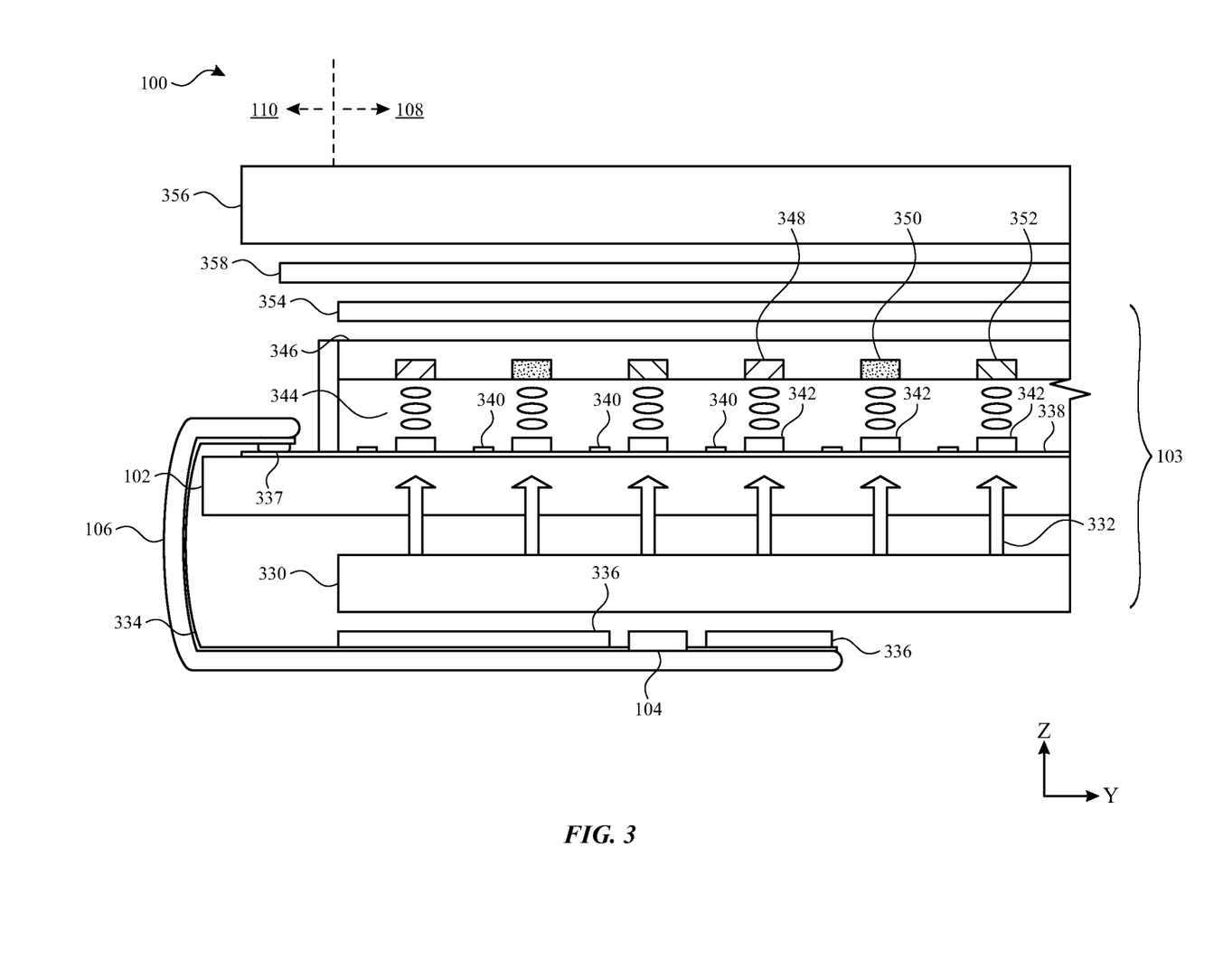
FIG. 3 is a sectional view of a liquid crystal display (LCD) device, in accordance with some embodiments.

FIG. 3 is a cross section view showing an example of a display device 100, in accordance with some embodiments. In the example shown in FIG. 3, the display device 100 is implemented as an LCD device having a display panel 103 implemented as an LCD display panel. The LCD display panel has a plurality of light transmitting pixels and a backlight unit (BLU) 330, which is configured to illuminate the light transmitting pixels from behind with respect to a viewing orientation of the LCD device. The display IC 104 is mounted to the flexible substrate 106 and disposed behind the BLU 330 so as to avoid occluding the display light 332 provided by the BLU 330 to the light transmitting pixels. A size of the inactive area 110 on the display panel 103 can in turn be reduced by avoiding a need to mount the display IC 104 directly on the panel in the inactive region.

The display IC 104 can be a semiconductor chip mounted to the flexible substrate 106 using, for example, a chip on flex (COF) construction. The flexible substrate 106 can provide a flexible circuit or flexible printed circuit (FPC) containing flexible traces 334 formed in or on one or more layers of a non-conductive material. The display IC 104 can be electrically connected to the flexible traces 334 using wire bond connections, solder bumps, or any other suitable electrical connection technology, which can, for example, also serve to provide a mechanical attachment between the display IC 104 and the flexible substrate 106.

As shown in FIG. 3, a spacer layer 336 can be disposed on a portion of the flexible substrate 106 near or around the display IC 104, between the flexible substrate 106 and the BLU 330. The display IC 104 can be disposed in a void of the spacer layer 336, such as a pocket, groove, recess, or aperture, to help maintain a structural integrity of the assembly and serve to provide a more controlled or uniform thickness of the portion of the flex assembly below the BLU 330.

As shown in FIG. 3, the flexible substrate 106 can be wrapped around an edge of the BLU 330 and an edge of the panel substrate 102 from a back side of the panel substrate 102, and a portion of the flexible substrate 106 can be attached to a front side of the panel substrate 102. The attachment 337 between the flexible substrate 106 and the panel substrate 102 can be, for example, an anisotropic conductive film (ACF) bond or any other suitable attachment method that can serve to electrically connected the flexible traces 334 to panel traces 338 formed on one or more layers over the panel substrate 102. Each of the flexible traces 334 and the panel traces 338 can be implemented as conductive traces, such as metal, conductive oxides, or the like, formed on their respective substrate.

In the example LCD device shown in FIG. 3, the panel substrate 102 can be implemented as a thin-film transistor (TFT) substrate made from, for example, a transparent glass layer or other suitable transparent material that is sufficiently transparent to permit the display light 332 provided by the BLU 330 positioned behind the TFT substrate to transmit through and illuminate the light transmitting pixels disposed in front of the TFT substrate. The BLU 330 can generally include any suitable layer or layers that are configured to provide light by emitting and/or directing display light 332 to the light transmitting pixels of the display panel 103. The BLU 330 can include, for example, a light pipe, a diffuse layer, a prism film, a reflective layer, and/or any other suitable layer or layers to permit the BLU 330 to direct light to the pixels from one or more light emitting diodes (LEDs) or other light emitters coupled to an edge of the BLU 330. Additionally or alternatively, it is contemplated that the BLU 330 can include an array of LEDs or other light emitters disposed directly behind the light transmitting pixels to provide direct illumination to the light transmitting pixels.

Referring to the example of FIG. 3, the panel substrate 102 may be implemented as a TFT substrate that serves to provide a support for forming a TFT layer or layers on the front side of the TFT substrate, directly or indirectly on the front surface of the TFT substrate. The TFT layer(s) can provide circuitry to provide a driving backplane for the display device 100. The TFT layer(s) or other circuitry can include, for example, panel traces 338 formed in one or more layers over the front side of the TFT substrate, one or more transistors 340 (e.g., TFTs) disposed at each light transmitting pixel or sub-pixel, and a pixel electrode 342 disposed at each pixel or sub-pixel. The transistors 340 can, for example, provide for an active matrix switching arrangement to selectively apply signals to each pixel. Other implementations are contemplated in which a passive matrix driving scheme is used.

In the example of FIG. 3, the panel traces 338 can provide for electrical interconnections between various components in the display panel 103, and between the display panel 103 and the flexible substrate 106 to permit the display IC 104 to provide signals to components of the display panel 103 via the flexible traces 334. A liquid crystal material 344 can be disposed over the TFT substrate in a sealed chamber or cell, and operatively coupled to the driving backplane and display IC 104 via pixel electrodes 342. The liquid crystal material 344 can utilize, for example, in-plane switching (IPS), twisted nematic (TN), or any other suitable arrangement to control an amount of light transmitted through each pixel or sub-pixel based on an alignment of the liquid crystal material 344. For example, the display IC 104 can be configured to apply voltage signals to each respective pixel electrode 342 based on frame data to control an alignment of the liquid crystal material 344 at each light transmitting pixel or sub-pixel to present an image.

As shown in FIG. 3, a color filter 346 can be disposed over the panel substrate 102 and over the liquid crystal material 344 to provide for a plurality of sub-pixels having different wavelengths. For example, the color filter 346 can include a first color component 348 corresponding to a first sub-pixel color, a second color component 350 corresponding to a second sub-pixel color, and a third color component 352 corresponding to a third sub-pixel color. Each of the color components can provide a respective wavelength-selective filter of the display light 332 to transmit their respective sub-pixel color. These color components can be repeated in, for example, a two-dimensional array configuration across the color filter 346 to collectively provide for an array of pixels across in which each pixel includes multiple sub-pixels having different colors based on filtering out different wavelengths of the display light 332. The color filter 346 can use, for an example, a red-green-blue (RGB) color model in which the first, second, and third color components correspond to red, green, and blue, respectively, or the color filter 346 can use any other suitable color model combining multiple different colored sub-pixel filter components to produce a color image. As shown in FIG. 3, a polarizer 354 (e.g., a polarizing filter film) can be disposed over the panel substrate 102 and over the color filter 346 to act on the light transmitted through the liquid crystal material 344 and provide for a desired image.

As shown in FIG. 3, a protective cover 356 can be disposed over the panel substrate 102 and other components of the display panel 103. The protective cover 356 can provide an external casing component that can serve to protect internal components of the electronic device, including, for example, the display panel 103 and any other components that may be included within a common device housing. The protective cover 356 can be implemented as a transparent cover that includes one or more transparent layers, such as, for example, a cover glass (which may be chemically hardened), a sapphire layer, a plastic layer, or any other suitable layer that may be made sufficiently transparent to permit display images to be viewed through the protective cover.

In some embodiments, a touch sensor 358 can be included so that touch input (e.g., from a finger, stylus, or other object) can be detected from a front surface of the protective cover 356. As shown in FIG. 3, the touch sensor 358 can be disposed above the functional components of the display panel 103, such as between the color filter 346 and the protective cover 356 or between the polarizer 354 and the protective cover 356. Although it is contemplated that some implementations can alternatively incorporate the touch sensor 358 directly within the display panel 103 (e.g., within the LCD cell or as part of the display electrodes and/or TFT layer(s)), implementing the touch sensor 358 outside of the functional components of the display panel 103 can, in some implementations, facilitate use of the touch sensor 358 for tap to wake functionality of the electronic device 200 or display device 100, even when the display panel 103 is off or powered down. This can, for example, be useful where the reduced inactive area 110 is used to provide an "edge-to-edge" display that otherwise has no physical buttons (such as a home button) on the front face of the electronic device 200 that could otherwise be used to wake the display or wake the electronic device 200 from a lower power mode of operation.

Referring to FIG. 3, the touch sensor 358 can include, for example, a capacitive sensor containing a plurality of sensing electrodes capable of detecting a presence or location of a conductive object on or over the protective cover 356 based on changes in capacitance caused by the conductive object. The sensing electrodes can be made from transparent conductive materials, such as indium tin oxide (ITO), metal mesh materials, or other materials that can provide for a sufficiently transparent touch sensor to permit display images to be viewed through the touch sensor 358. The sensing electrodes can be formed, for example, on a discrete film dedicated for the touch sensor, on a back surface of the protective cover 356, or on top of the color filter 346. Although capacitive sensing is described as an example, it is contemplated that the touch sensor 358 can utilize other sensing technologies, such as resistive or inductive sensing.

Figure 4:
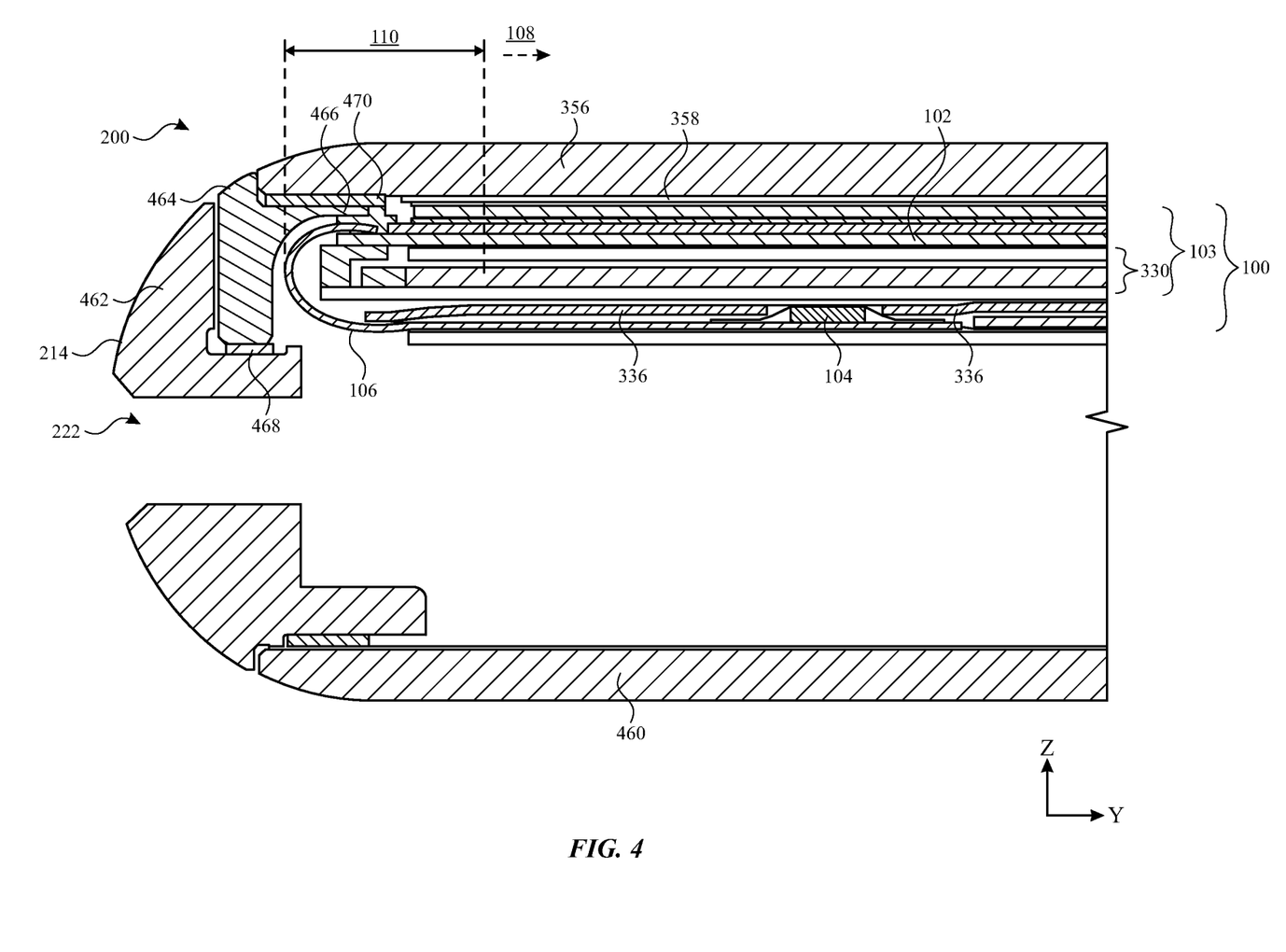
FIG. 4 is a sectional view of a display device assembly, in accordance with some embodiments.

FIG. 4 is a cross section view showing an example of an electronic device 200, in accordance with some embodiments. The electronic device 200 shown in FIG. 4 includes the display device 100 assembled in the same LCD configuration shown in FIG. 3 and assembled within a housing 214.

As shown in FIG. 4, the electronic device 200 can include a housing 214 that includes a sidewall adjoining the protective cover 356 and a back cover 460. In this example, the protective cover 356 is implemented as a front cover corresponding to a front side of the electronic device 200, and the back cover 460 corresponds to a back side of the electronic device 200 opposite the front side. The sidewall adjoining the front cover and the back cover 460 can serve to encircle and provide an enclosure for internal components of the electronic device 200. Internal components such as a speaker and/or connector are not visible in FIG. 4 but can be disposed between the display IC 104 and the back cover 460. Although examples are described herein with reference to discrete housing components adjoined together, it is contemplated that in various implementations any two or more of the described housing components can be instead formed as a single integral component.

The housing 214 is assembled together with the display device 100 in a manner that can provide mechanically robust construction with a reduced inactive border region to substantially provide an appearance of an "edge-to-edge" display. For example as shown in FIG. 4, the housing 214 can include a sidewall component that is attached to the inactive region of the display panel 103, such as attached to the flexible substrate 106 itself and/or attached to the inactive area 110 of the panel substrate 102. The sidewall can include a lip 466, which is coupled between the panel substrate 102 and the protective cover in a Z-direction extending normal to the viewing area, and coupled in an area neighboring components of the display positioned over the panel substrate 102, such as the touch sensor 358 and/or polarizer 354. This may help to maintain a consistent Z-height over the display panel assembly, while allowing for a robust seal with a reduced display border design.

As shown in FIG. 4, the sidewall can include a first sidewall component 462 and a second sidewall component 464. In some embodiments, the first and second sidewall components may be made from different materials. For example, the second sidewall component 464 may be made from a plastic material, and the first sidewall component 462 can be made from a metal material, such as aluminum or steel. It is contemplated that other implementations may use different materials or in some implementations the discrete sidewall components can be made from the same material.

The second sidewall component 464 can provide a frame that surrounds the display device 100 and can be coupled between the first sidewall component and the second sidewall component 464. The second sidewall component 464 can include a lip 466, which extends partially over the display device 100 and can obscure at least portion of the inactive area 110 of the display device 100. For example, and as shown in FIG. 4, the lip 466 can overlap with the portion of the flexible substrate 106 that is attached to the front side of the display panel 103.

As shown for example in FIG. 4, the lip 466 can be a horizontally extending member, e.g., extending in a direction transverse to the viewing area, and the second sidewall component 464 can include another portion implemented as a vertically extending member, e.g., extending normal to the viewing area. The vertically extending member can at least partially surround the panel substrate 102, while the horizontally extending member can be bonded to the protective cover 356 over a portion of the panel substrate 102 in the inactive area 110. As used herein, the terms "vertical" or "vertically extending" and "horizontal" or "horizontally extending" refer to a relative frame of reference, not an absolute or gravitational frame of reference. In this relative of reference, each of the vertical/vertically extending and horizontal/horizontally extending directions can refer to any arbitrary frame of reference in an absolute sense, so long as the vertical/vertically extending directions are orthogonal or substantially orthogonal to the horizontal/horizontally extending direction.

The second sidewall component 464 can be coupled to the first sidewall component and the protective cover 356 using a first seal 468 and a second seal 470, respectively. Each of the first and second seals may, for example, be implemented using adhesives or other bonding materials, and can, for example, provide a water tight seal. As shown in FIG. 4, a front surface of the lip 466 (upper surface with respect to the orientation shown in FIG. 4) can be bonded to the protective cover 356 using the second seal 470, and a back surface of the lip 466 (lower surface with respect to the orientation shown in FIG. 4) can be bonded to the flexible substrate 106. A side surface of the vertically extending member (left surface with respect to the orientation shown in FIG. 4) can be bonded to the first sidewall component 462.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language of the claims and to encompass all legal equivalents. Notwithstanding, none of the claims are intended to embrace subject matter that fails to satisfy the requirements of the applicable patent law, nor should they be interpreted in such a way.

What is claimed is:

1. A display device assembly comprising:
   a first substrate;
   multiple light transmitting pixels disposed over the first substrate;
   a backlight unit disposed under the first substrate;
   a flexible substrate attached to the first substrate;
   a display integrated circuit mounted to the flexible substrate and disposed under the backlight unit;
   a printed circuit board disposed under the backlight unit, wherein the display integrated circuit is configured to communicate with the printed circuit board via the flexible substrate; and
   a spacer layer disposed under the backlight unit, wherein the spacer layer has a void under the backlight unit, wherein the display integrated circuit is disposed in the void of the spacer layer and mounted to a portion of the flexible substrate that is below the spacer layer.

2. The display device assembly of claim 1, further comprising:
   a protective cover disposed over the multiple light transmitting pixels; and
   a sidewall component comprising a vertically extending member and a horizontally extending member, wherein the vertically extending member at least partially surrounds the first substrate, and wherein the horizontally extending member is bonded to the protective cover and disposed over a portion of the first substrate that is outside of an area of the multiple light transmitting pixels.

3. The display device assembly of claim 2, wherein the horizontally extending member has a first surface bonded to the protective cover, and a second surface bonded to the flexible substrate.

4. The display device assembly of claim 2, wherein the multiple light transmitting pixels are arranged in a two-dimensional array, wherein the vertically extending member extends in a direction normal to the two-dimensional array, and wherein the horizontally extending member extends in a direction transverse to the two-dimensional array.

5. The display device assembly of claim 1, further comprising:
   one or more electronic components disposed below the display integrated circuit, wherein the display integrated circuit overlaps with the one or more electronic components.

6. The display device assembly of claim 5, wherein the one or more electronic components include a connector for transmitting at least one of data and power.

7. The display device assembly of claim 6, wherein the one or more electronic components further include a speaker.

8. A display device assembly comprising:
   a liquid crystal display panel having a front side configured to display images, a back side opposite to the front side, an active area having an array of pixels, and an inactive area outside of the active area;
   a flexible circuit having conductive traces, a first portion attached to the front side of the liquid crystal display panel in the inactive area, a second portion extending around an edge of the liquid crystal display panel, and a third portion behind the back side of the liquid crystal display panel;
   a display integrated circuit mounted to the third portion of the flexible circuit and electrically connected to the array of pixels via the conductive traces of the flexible circuit;
   a printed circuit board disposed under the liquid crystal display panel, wherein the display integrated circuit is connected to the printed circuit board via the third portion of the flexible circuit; and
   a spacer layer disposed between the back side of the liquid crystal display panel and the third portion of the flexible circuit in an area that is behind the back side of the liquid crystal display panel and around the display integrated circuit.

9. The display device assembly of claim 8, further comprising:
   a housing enclosing the liquid crystal display panel, the flexible circuit, and the display integrated circuit therein, the housing comprising a front cover in front of the liquid crystal display panel, a back cover behind the display integrated circuit, and a sidewall encircling the liquid crystal display panel and adjoining the front cover and the back cover,
   wherein the sidewall comprises a lip coupled between the front cover and the liquid crystal display panel in the inactive area.

10. The display device assembly of claim 9, wherein the lip has a front surface and a back surface opposite to the front surface, wherein the front surface is bonded to the front cover, and the back surface is bonded to the first portion of the flexible circuit.

11. The display device assembly of claim 8, further comprising:
    at least one other functional component; and
    a housing enclosing the liquid crystal display panel, the flexible circuit, the display integrated circuit, and the at least one other functional component therein, the housing comprising a front cover in front of the liquid crystal display panel, a back cover behind the display integrated circuit, and a sidewall encircling the liquid crystal display panel and adjoining the front cover and the back cover,
    wherein the at least one other functional component is positioned between the display integrated circuit and the back cover.

12. The display device assembly of claim 11, wherein the sidewall comprises a connector opening extending therethrough, and the at least one other functional component comprises a connector configured to exchange power and data through the connector opening.

13. The display device assembly of claim 8, wherein the liquid crystal display panel comprises:
- a thin-film transistor substrate having a front side and a back side;
- a liquid crystal material in front of the front side of the thin-film transistor substrate; and
- a backlight unit behind the back side of the thin-film transistor substrate and in front of the third portion of the flexible circuit, wherein the backlight unit is configured to provide light through the thin-film transistor substrate and through the liquid crystal material.

14. A display device assembly comprising:
- a panel substrate having a first side and a second side opposite to the first side;
- an array of light transmitting pixels formed on the first side of the panel substrate, wherein the array of light transmitting pixels define an active region and an inactive region of the panel substrate;
- a flexible substrate having a first end and a second end, wherein the first end is attached to the first side of the panel substrate in the inactive region, and the panel substrate is positioned between the first end and the second end of the flexible substrate;
- an integrated circuit attached to the flexible substrate and configured to apply signals to the array of light transmitting pixels to present an image, wherein the integrated circuit is on a side of the panel substrate that is opposite the first end of the flexible substrate;
- a printed circuit board comprising a processor and a memory, the printed circuit board being connected to the second end of the flexible substrate and disposed on the side of the panel substrate that is opposite the first end of the flexible substrate;
- a backlight unit positioned between the panel substrate and the integrated circuit; and
- a spacer layer surrounding the integrated circuit in a region that is positioned between the backlight unit and the second end of the flexible substrate.

15. The display device assembly of claim 14, further comprising:
- a housing having a transparent cover, and a sidewall having a lip between the transparent cover and the panel substrate in the inactive region.

16. The display device assembly of claim 14, further comprising:
- a housing having a first cover, a second cover, and an opening; and
- an internal component disposed within the housing and configured to transmit or receive through the opening,
- wherein the panel substrate is between the first cover and the second cover, and
- wherein the internal component is between the integrated circuit and the second cover.

17. The display device assembly of claim 14, wherein an areal extent of the integrated circuit overlaps with an areal extent of the active region.

* * * * *